(12) United States Patent
Huang et al.

(10) Patent No.: US 9,750,153 B2
(45) Date of Patent: Aug. 29, 2017

(54) LAN PORT CONSOLIDATION IN RACK ARCHITECTURE

(71) Applicant: Quanta Computer Inc., Taoyuan (TW)

(72) Inventors: Jen-Hsuen Huang, Taoyuan (TW); Fa-Da Lin, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 199 days.

(21) Appl. No.: 14/690,797

(22) Filed: Apr. 20, 2015

(65) Prior Publication Data

US 2016/0073542 A1 Mar. 10, 2016

Related U.S. Application Data

(60) Provisional application No. 62/047,551, filed on Sep. 8, 2014.

(51) Int. Cl.
*H05K 7/00* (2006.01)
*H05K 7/14* (2006.01)
*H05K 7/18* (2006.01)

(52) U.S. Cl.
CPC ......... *H05K 7/1422* (2013.01); *H05K 7/1441* (2013.01); *H05K 7/1452* (2013.01); *H05K 7/1492* (2013.01); *H05K 7/183* (2013.01)

(58) Field of Classification Search
CPC .. H05K 7/1422; H05K 7/1441; H05K 7/1452; H05K 7/1492; H05K 7/183
See application file for complete search history.

(56) References Cited

U.S. PATENT DOCUMENTS

| | | | | |
|---|---|---|---|---|
| 2002/0090844 | A1* | 7/2002 | Kocin | H05K 1/14 439/74 |
| 2006/0274508 | A1* | 12/2006 | LaRiviere | H05K 7/1488 361/727 |
| 2007/0238326 | A1* | 10/2007 | Fallah-Adl | H05K 7/1451 439/67 |
| 2009/0144568 | A1* | 6/2009 | Fung | G06F 1/3203 713/300 |
| 2012/0019117 | A1* | 1/2012 | Dunwoody | H05K 7/1491 312/330.1 |
| 2013/0091579 | A1* | 4/2013 | White | H04L 63/1416 726/25 |

\* cited by examiner

*Primary Examiner* — Yuriy Semenenko
(74) *Attorney, Agent, or Firm* — Nixon Peabody LLP; Eduardo J. Quinones; Zhou Lu

(57) ABSTRACT

A system includes a top-of-rack, a first plurality of chassis, and a first backplane. The first plurality of chassis each includes at least one rack module and a chassis network switch that connects to each of the at least one rack module. The first backplane includes a first backplane network switch that connects to the top-of-rack and connects to each of the first plurality of chassis via the chassis network switch of each of the first plurality of chassis.

14 Claims, 6 Drawing Sheets

LAN PORT CONSOLIDATION IN RACK ARCHITECTURE

CROSS-REFERENCE TO RELATED APPLICATIONS

This application claims the benefit of U.S. Provisional Patent Application Ser. No. 62/047,551 entitled "FLEXIBLE RSA DESIGN", which was filed Sep. 8, 2014. The aforementioned application is herein incorporated by reference in its entirety.

FIELD OF INVENTION

This application relates to computer systems, and more particularly to a system and method for local area network (LAN) port consolidation in rack architecture.

BACKGROUND

Computer server systems in modern data centers are commonly mounted in specific configurations on server racks for which a number of computing modules, such as trays, chassis, sleds, etc., are positioned and stacked relative on top of each other within the server racks. Rack mounted systems allow for a vertical arrangement of the computing modules to use space efficiently. Generally, each computing module can be slid into and out of the server rack, and various cables such as input/output (IO) cables, network cables, power cables, etc., can connect to the computing modules at the front or rear of the rack. Each computing module can contain one or more computer servers or may hold one or more computer server components. For example computing modules can include modules for processing, storage, network controllers, disk drives, cable ports, power supplies, etc. A large number of cables can be coupled to the computing modules mounted on each server rack.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In accordance with one or more aspects of the examples described herein, a system is provided for LAN port consolidation in rack architecture. A system can include a top-of-rack, a first plurality of chassis, and a first backplane. The first plurality of chassis can each include at least one rack module and a chassis network switch that connects to each of the at least one rack module. The first backplane can include a first backplane network switch that connects to the top-of-rack and connects to each of the first plurality of chassis via the chassis network switch of each of the first plurality of chassis.

In another aspect, a system can include a top-of-rack, a first backplane, and a second backplane. The first backplane can include a first backplane top connector that connects to the top-of-rack, a first backplane bottom connector, and a first backplane network switch that connects to the first backplane top connector and to the first backplane bottom connector. The second backplane can include a second backplane top connector that connects to the first backplane bottom connector, a second backplane bottom connector, and a second backplane network switch that connects to the second backplane top connector and to the second backplane bottom connector.

In yet another aspect, a method is provided for LAN port consolidation in rack architecture. The method can include receiving network data from each of a plurality of rack modules at a chassis network switch of a first chassis. The method can include receiving network data from the first chassis at a first backplane network switch. The method can include receiving network data from a second backplane at the first backplane network switch. The method can further include receiving network data from first backplane network switch at a top-of-rack.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides techniques for LAN port consolidation in rack architecture in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

Computer server systems in modern data centers are commonly mounted in specific configurations on server racks for which a number of computing modules, such as trays, are positioned and stacked relative on top of each other within the server racks. Rack mounted systems allow for a vertical arrangement of the computing modules to use space efficiently. Generally, each computing module can be slid into and out of the server rack, and various cables such as input/output (IO) cables, network cables, power cables, etc., can connect to the computing modules at the front or rear of the rack. Each computing module can contain one or more computer servers or may hold one or more computer server components. A large number of cables can be coupled to the computing modules mounted on each server rack, and thus disconnecting and connecting the correct cables can be complex, time consuming, and error prone for any service technician. In addition, the large number of cables can become entangled and therefore easily damaged or disconnected.

In accordance with one or more aspects of the subject technology, a server rack can include a top-of-rack that consolidates all network cables in the server rack originating from one or more backplanes. Each backplane can, in turn, consolidate all network cables from a plurality of chassis. Each chassis can, in turn, consolidate cables from a plurality of rack modules in the chassis. In this manner, a single network cable can be used to connect all rack modules in the server rack.

Figure 1:
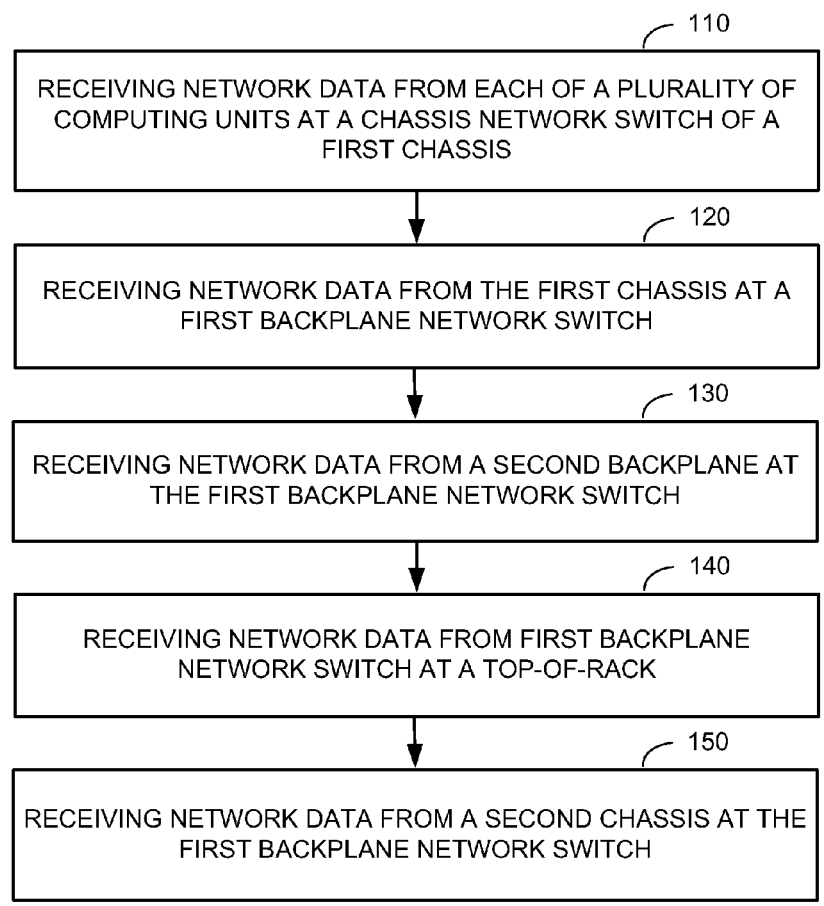
FIG. 1 illustrates an example methodology for LAN port consolidation in rack architecture.

FIG. 1 illustrates an example methodology 100 for LAN port consolidation in rack architecture. The method 100 can involve, at step 110, receiving network data from each of a plurality of rack modules at a chassis network switch of a first chassis. The method 100 can involve, at step 120, receiving network data from the first chassis at a first backplane network switch. The method 100 can involve, at step 130, receiving network data from a second backplane at the first backplane network switch. The method 100 can optionally involve, at step 140, receiving network data from first backplane network switch at a top-of-rack. The method 100 can optionally involve, at step 150, receiving network data from a second chassis at the first backplane network switch.

Figure 2:
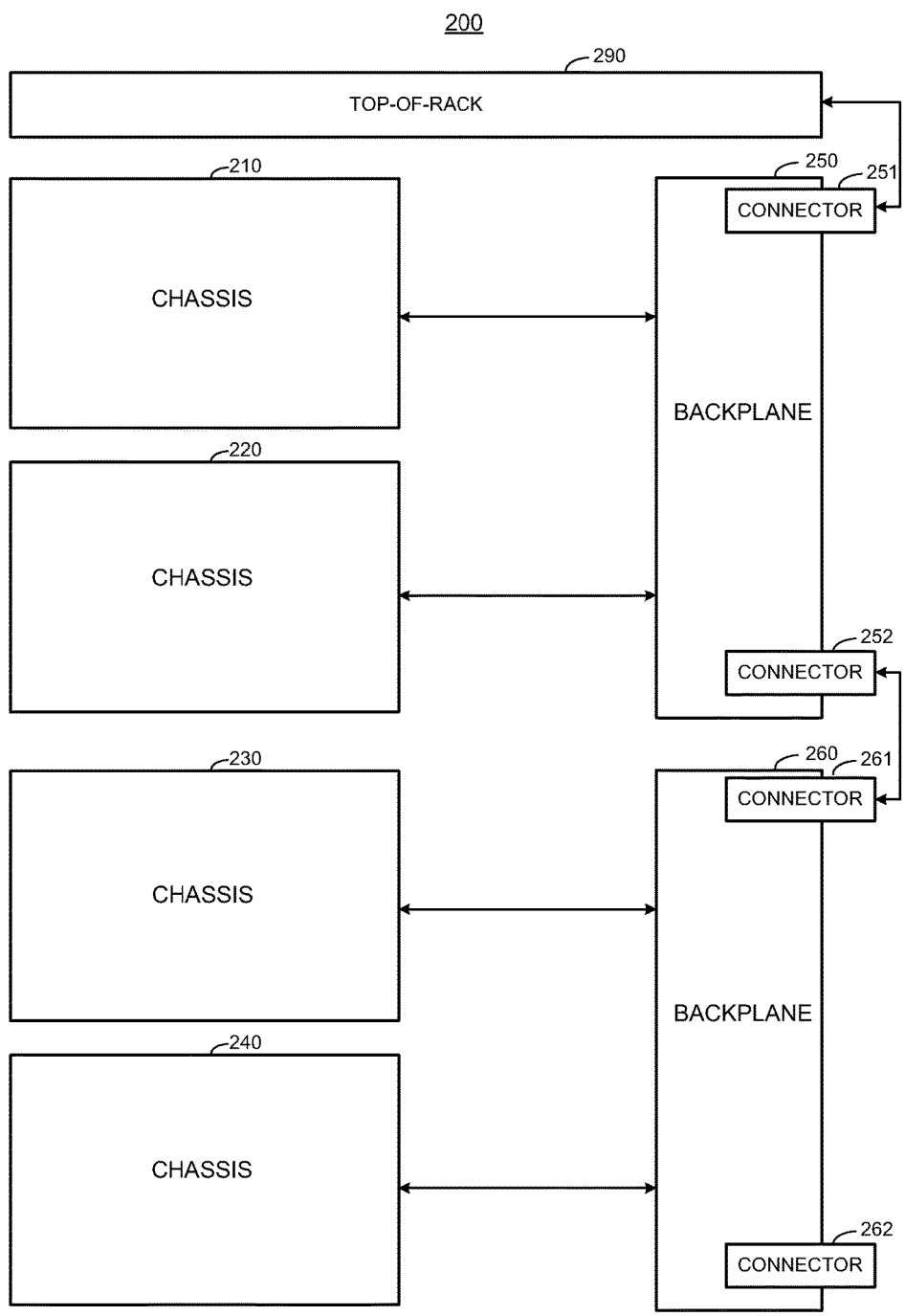
FIG. 2 illustrates a block diagram of an example system for LAN port consolidation in rack architecture.

FIG. 2 illustrates a block diagram of an example system 200 for LAN port consolidation in rack architecture. The system 200 (e.g., server rack) can include a first plurality of chassis 210, 220, and a first backplane 250. In a related aspect, the system 200 can further include a second plurality of chassis 230, 240 and a second backplane 260. In a related aspect, the system 200 can further include a top of rack 290. The first backplane 250 can, for example, fit behind the first plurality of chassis 210, 220. The second backplane 260 can, for example, fit behind the second plurality of chassis 230, 240. In a related aspect the system 200 can further include at least one additional chassis (not shown) and at least one additional backplane (not shown).

Each chassis 210, 220, 230, 240 can have varying dimensions, with chassis height often measured in unit U. A chassis width can be, for example, full-rack (i.e., takes up the entire enclosure width of the server rack 200) or half-rack (i.e., takes up half the enclosure width of the server rack 200).

Similarly, each backplane 250, 260 can have varying dimensions. For example, the first backplane 250 can have a same width and height as that of the chassis 210 that the first backplane 250 fits behind.

The first backplane 250 can include a first backplane top connector 251 and a first backplane bottom connector 252. Similarly, the second backplane 260 can include a second backplane top connector 261 and a second backplane bottom connector 262. In a related aspect, each additional backplane (not shown) can include a backplane top connector and a backplane bottom connector.

The first backplane 250 can connect to the top-of-rack 290 via the first backplane top connector 251. The first backplane 250 can connect to the second backplane 260 via the first backplane bottom connector 252 and the second backplane top connector 261. In a related aspect, additional backplanes (not shown) can be similarly connected to one another in series via the backplane top connector and the backplane bottom connector. The first backplane 250 can connect to each of the first plurality of chassis 210, 220. The second backplane 260 can connect to each of the second plurality of chassis 230, 240.

As shown, network connections from the first plurality of chassis 210, 220 and additional chassis (not shown) can be consolidated into the first backplane 250. Network connections from the first backplane 250, the second backplane 260, and additional backplanes (not shown) can be consolidated into the top-of-rack 290.

Figure 3:
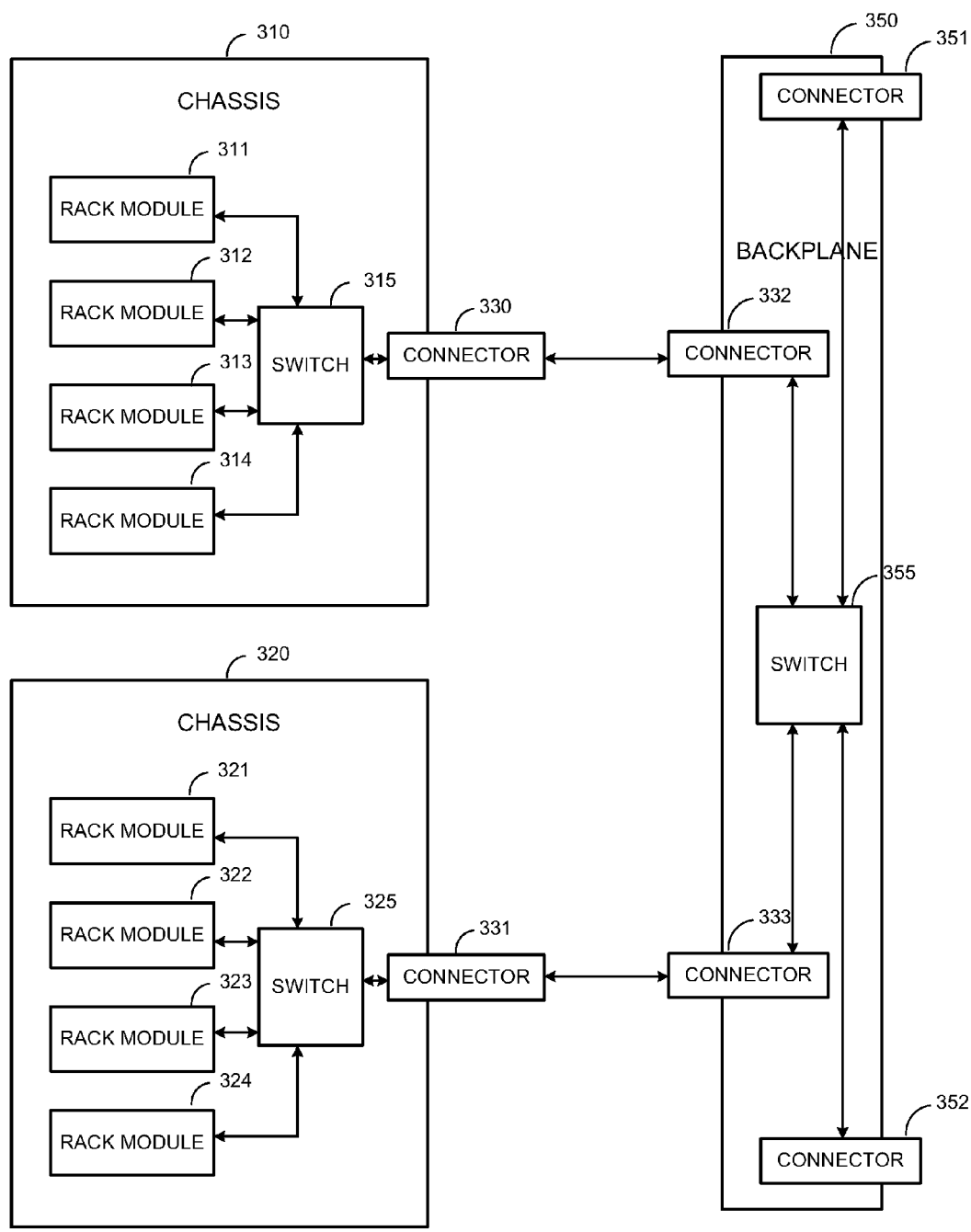
FIG. 3 illustrates a block diagram of part of an example system for LAN port consolidation in rack architecture.

FIG. 3 illustrates a block diagram of part of an example system 300 for LAN port consolidation in rack architecture. The system 300 (e.g., server rack) can include a first chassis 310, a second chassis 320, and a backplane 350. In a related aspect, the system 300 can further include at least one additional chassis (not shown). The backplane 350 can, for example, fit behind the first chassis 310 and the second chassis 320.

The first chassis 310 can include rack modules 311-314, a first chassis network switch 315, and a first chassis connector 330. In a related aspect, the first chassis 310 can include more or less rack modules than shown. Each of the rack modules 311-314 can be any equipment such as a computer server or a network equipment module with a network port (e.g., LAN port, RJ45 port, etc.). Each of the rack modules 311-314 can connect to the first chassis network switch 315. For example, a Serializer/Deserializer (SerDes) interface or a network cable (e.g., Ethernet or category 5 cable) can connect the network port of each of the rack modules 311-314 to the first chassis network switch 315. The first chassis network switch 315 can connect to the first chassis connector 330, by for example, a network cable.

The second chassis 320 can include rack modules 321-324, a second chassis network switch 325, and a second chassis connector 331. Each of the rack modules 321-324 can be any equipment such as a computer server or a network equipment module with a network port (e.g., LAN port, RJ45 port, etc.). Each of the rack modules 321-324 can connect to the second chassis network switch 325. For example, a network cable (e.g., Ethernet or category 5 cable) can connect the network port of each of the rack modules 321-324 to the second chassis network switch 325. The second chassis network switch 325 can connect to the second chassis connector 331, by for example, a SerDes interface or a network cable (e.g., Ethernet or category 5 cable).

The backplane 350 can include a backplane network switch 355, backplane connectors 332, 333, a backplane top connector 351, and a backplane bottom connector 352. The backplane network switch 355 can connect to backplane connectors 332, 333, the backplane top connector 351, and the backplane bottom connector 352, by for example, a network cable. The backplane 350 can connect to the first chassis 310 and to the second chassis 320 by connecting the backplane connectors 332, 332 to the first chassis connector 330 and the second chassis connector 331, by for example, network cables.

As shown, network connections from the rack modules 311-314 can be consolidated to the first chassis connector 330 of the first chassis 310 and similarly network connections from the rack modules 321-324 can be consolidated to the second chassis connector 331 of the second chassis 320. Network connections from the first chassis 310, the second chassis 320, and additional chassis (not shown) can be consolidated into the backplane 350.

Figure 4:
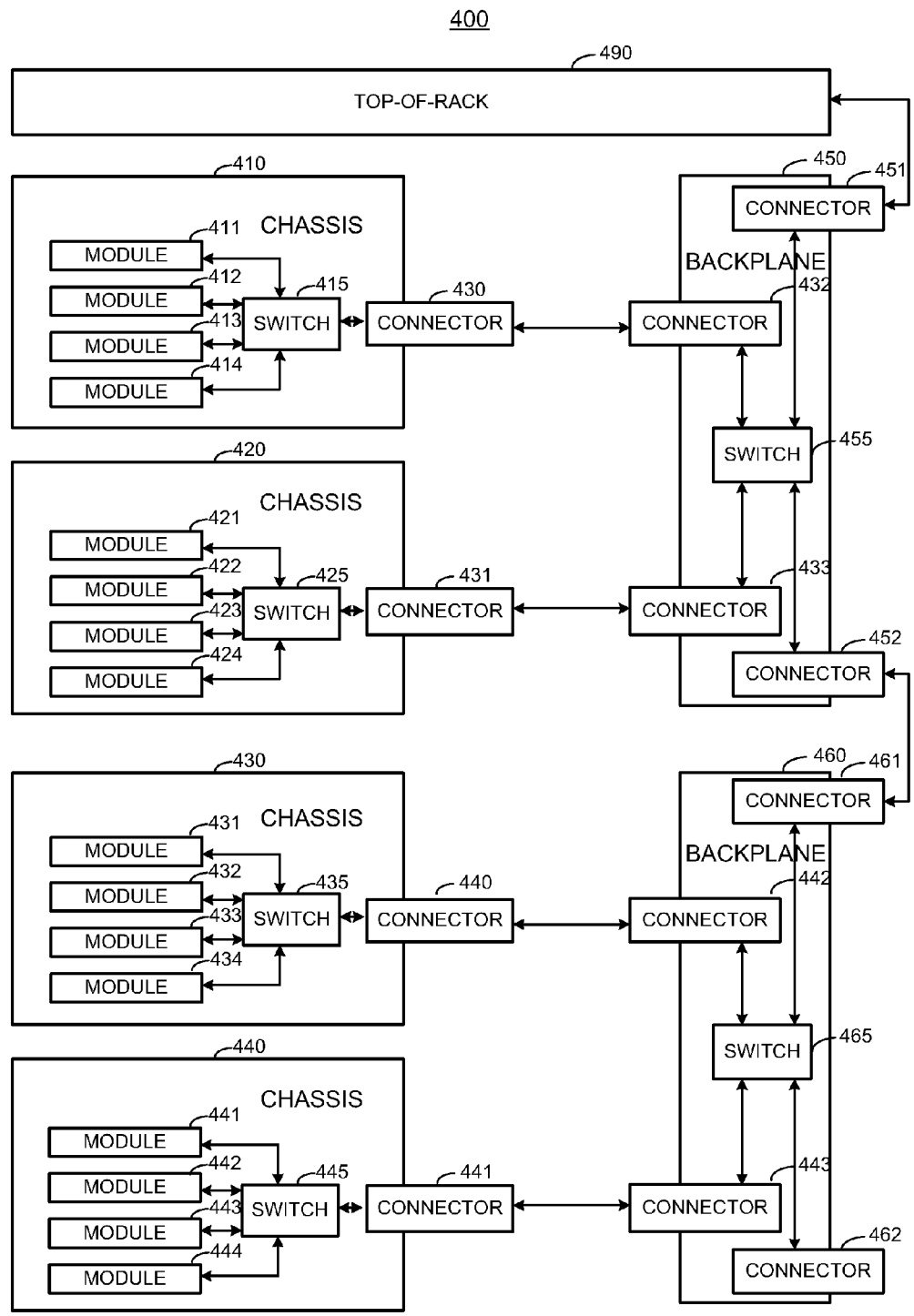
FIG. 4 illustrates a block diagram of another example system for LAN port consolidation in rack architecture.

FIG. 4 illustrates a block diagram of another example system for LAN port consolidation in rack architecture. The system 400 (e.g., server rack) can include a first plurality of chassis 410, 420, a first backplane 450, and a top-of-rack 490. In a related aspect, the system 400 can further include a second plurality of chassis 430, 440 and a second backplane 460. The first backplane 450 can, for example, fit behind the first plurality of chassis 410, 420. The second backplane 460 can, for example, fit behind the second plurality of chassis 430, 440. In a related aspect the system 400 can further include at least one additional chassis (not shown) and at least one additional backplane (not shown).

Each chassis 410, 420, 430, 440 can include rack modules (e.g., computing sleds, server modules, networking modules, etc.) 411-414, 421-424, 431-434, 441-444, a chassis network switch 415, 425, 435, 445, and a chassis connector 430, 431, 440, 441. The computing sleds are computing modules that can be slid into and out of the corresponding chassis 410, 420, 430 and 440. In a related aspect, each chassis 410, 420, 430, 440 can include more or less rack modules than shown. Each chassis network switch 415, 425, 435, 445 can connect to the chassis connector 430, 431, 440, 441.

The first backplane 450 can include a first backplane network switch 455, first backplane connectors 432, 433, a first backplane top connector 451, and a first backplane bottom connector 452. The first backplane network switch 455 can connect to first backplane connectors 432, 433, the first backplane top connector 451, and the first backplane bottom connector 452. The first backplane 450 can connect to each of the first plurality of chassis 410, 420 by connecting the first backplane connectors 432, 433 to the chassis connectors 430, 431.

The second backplane 460 can include a second backplane network switch 465, second backplane connectors 442, 443, a second backplane top connector 461, and a second backplane bottom connector 462. The second backplane network switch 465 can connect to second backplane connectors 442, 443, the second backplane top connector 461, and the second backplane bottom connector 462. The second backplane 460 can connect to each of the second plurality of chassis 430, 440 by connecting the second backplane connectors 442, 443 to the chassis connectors 440, 441.

The first backplane 450 can connect to the top-of-rack 490 via the first backplane top connector 451. The first backplane 450 can connect to the second backplane 460 via the first backplane bottom connector 452 and the second backplane top connector 461. In a related aspect, additional backplanes (not shown) can be similarly connected to one another in series via the backplane top connector and the backplane bottom connector.

Figure 5:
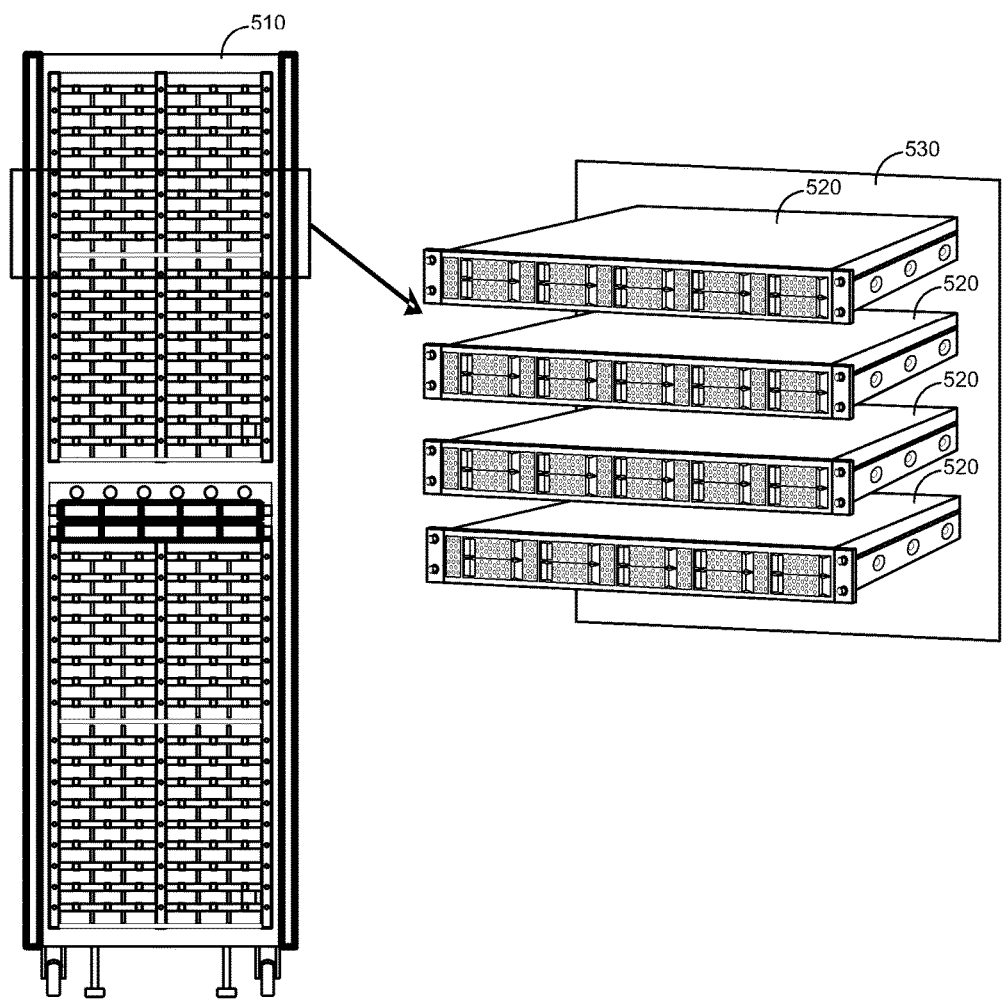
FIG. 5 illustrates an example server rack.

FIG. 5 illustrates an example server rack 510. The server rack can be a tower structure designed to reduce the space occupied by a large number of computer servers and other network equipment modules. Besides computer servers, many specialized network equipment are built to be mountable on server rack 510, such as storage drives, exchangers, routers, hardware firewalls, power supplies, etc.

The server rack 510 can be designed like a drawer enclosure with a number of sliding compartments (i.e., chassis) 520. The enclosure (i.e., internal) width of the server rack 510 can be 19 inches. The enclosure height of the server rack 510 is typically measured by the unit U (1 U is 1.75 inches or 44.45 millimeters). The enclosure height of the server rack can be 42 U (73.5 inches or 1.8669 meters). Although enclosure width and height is standardized, various server rack manufacturers can produce server racks with different external widths, heights, and depths. Chassis (i.e., sliding compartments) 520 can be mounted on the server rack 510. Common chassis that fit into the server rack 510 can each have a height of 1-7U. Each chassis 520 can mount one or more computer sever or other network equipment modules.

The server rack 510 can include one or more backplanes 530, located behind a set number of chassis 520 and at a rear of the server rack. The backplane 530 can be used as a part of a rear side of the server rack 510. The backplane 530 can include a number of connectors and cable management features. The backplane 530 can be removably attached to the rear of the server rack or can be rotably attached to the rear of the server rack via one or more hinges.

Figure 6:
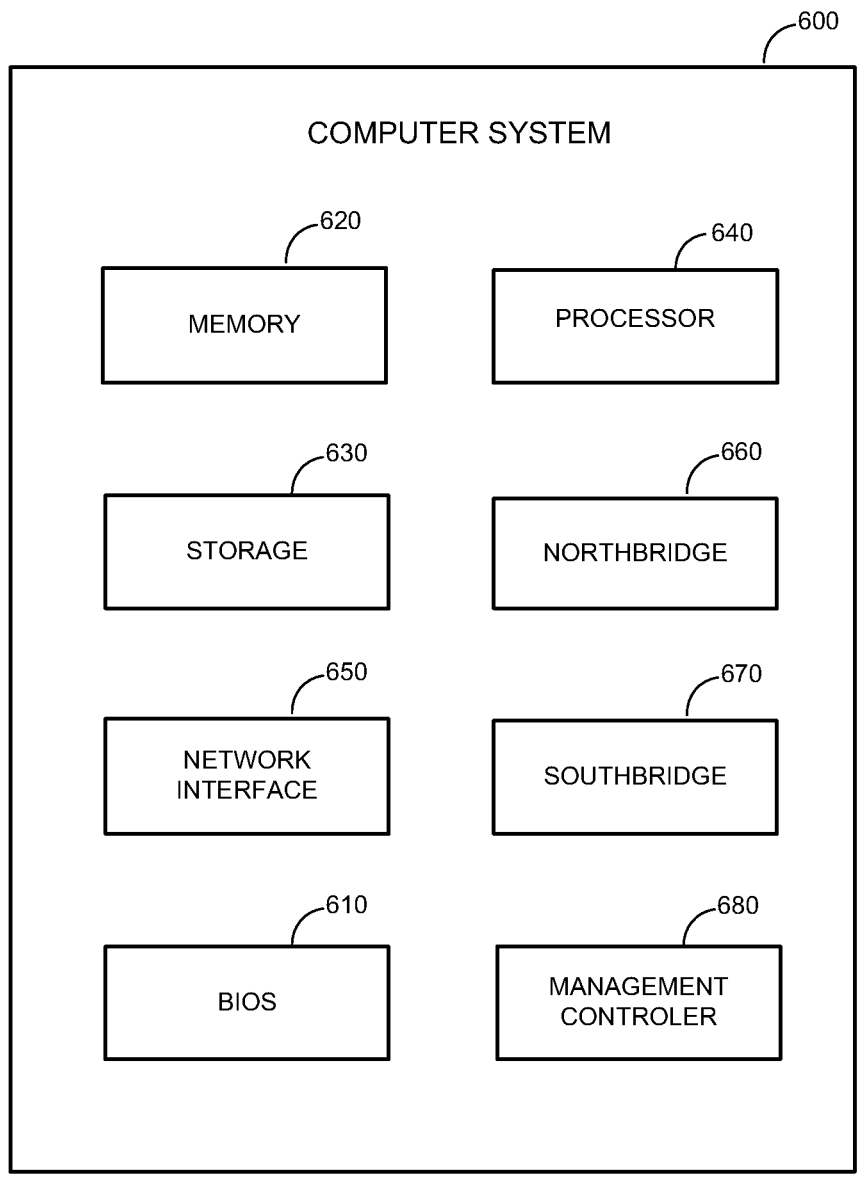
FIG. 6 illustrates a block diagram of an example computer system.

FIG. 6 illustrates a block diagram of an example computer system 600. The computer system 600 can include a processor 640, a network interface 650, a management controller 680, a memory 620, a storage 630, a BIOS 610, a northbridge 660, and a southbridge 670.

The computer system 600 can be, for example, a server (e.g., a server in a server rack of a data center) or a personal computer. The processor (e.g., central processing unit (CPU)) 640 can be a chip on a motherboard that can retrieve and execute programming instructions stored in the memory 620. The processor 640 can be a single CPU with a single processing core, a single CPU with multiple processing cores, or multiple CPUs. One or more buses (not shown) can transmit instructions and application data between various computer components such as the processor 640, memory 620, storage 630, and networking interface 650.

The memory 620 can include any physical device used to temporarily or permanently store data or programs, such as various forms of random-access memory (RAM). The storage 630 can include any physical device for non-volatile data storage such as a HDD or a flash drive. The storage 630 can have a greater capacity than the memory 620 and can be more economical per unit of storage, but can also have slower transfer rates.

The BIOS 610 can include a Basic Input/Output System or its successors or equivalents, such as an Extensible Firmware Interface (EFI) or Unified Extensible Firmware Interface (UEFI). The BIOS 610 can include a BIOS chip located on a motherboard of the computer system 600 storing a BIOS software program. The BIOS 610 can store firmware executed when the computer system is first powered on along with a set of configurations specified for the BIOS 610. The BIOS firmware and BIOS configurations can be stored in a non-volatile memory (e.g., NVRAM) or a ROM such as flash memory. Flash memory is a non-volatile computer storage medium that can be electronically erased and reprogrammed.

The BIOS 610 can be loaded and executed as a sequence program each time the computer system 600 is started. The BIOS 610 can recognize, initialize, and test hardware present in a given computing system based on the set of configurations. The BIOS 610 can perform self-test, such as a Power-on-Self-Test (POST), on the computer system 600. This self-test can test functionality of various hardware components such as hard disk drives, optical reading devices, cooling devices, memory modules, expansion cards and the like. The BIOS can address and allocate an area in the memory 620 in to store an operating system. The BIOS 610 can then give control of the computer system to the OS.

The BIOS 610 of the computer system 600 can include a BIOS configuration that defines how the BIOS 610 controls various hardware components in the computer system 600. The BIOS configuration can determine the order in which the various hardware components in the computer system 600 are started. The BIOS 610 can provide an interface (e.g., BIOS setup utility) that allows a variety of different parameters to be set, which can be different from parameters in a BIOS default configuration. For example, a user (e.g., an administrator) can use the BIOS 610 to specify clock and bus speeds, specify what peripherals are attached to the computer system, specify monitoring of health (e.g., fan speeds and CPU temperature limits), and specify a variety of other parameters that affect overall performance and power usage of the computer system.

The management controller 680 can be a specialized microcontroller embedded on the motherboard of the computer system. For example, the management controller 680 can be a baseboard management controller (BMC). The management controller 680 can manage the interface between system management software and platform hardware. Different types of sensors built into the computer system can report to the management controller 680 on parameters such as temperature, cooling fan speeds, power status, operating system status, etc. The management controller 680 can monitor the sensors and have the ability to send alerts to an administrator via the network interface 650 if any of the parameters do not stay within preset limits, indicating a potential failure of the system. The administrator can also remotely communicate with the management controller 680 to take some corrective action such as resetting or power cycling the system to restore functionality.

The northbridge 660 can be a chip on the motherboard that can be directly connected to the processor 640 or can be integrated into the processor 640. In some instances, the northbridge 660 and the southbridge 670 can be combined into a single die. The northbridge 660 and the southbridge 670, manage communications between the processor 640 and other parts of the motherboard. The northbridge 660 can manage tasks that require higher performance than the southbridge 670. The northbridge 660 can manage communications between the processor 640, the memory 620, and video controllers (not shown). In some instances, the northbridge 660 can include a video controller.

The southbridge 670 can be a chip on the motherboard connected to the northbridge 660, but unlike the northbridge 660, is not directly connected to the processor 640. The southbridge 670 can manage input/output functions, such as Universal Serial Bus (USB), audio, serial, BIOS, Serial Advanced Technology Attachment (SATA), Peripheral Component Interconnect (PCI) bus, PCI eXtended (PCI-X) bus, PCI Express bus, ISA bus, SPI bus, eSPI bus, SMBus, of the computer system 600. The southbridge 670 can connect to or can include within the southbridge 670 the management controller 670, Direct Memory Access (DMAs) controllers, Programmable Interrupt Controllers (PICS), and a real-time clock.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

In one or more exemplary designs, the functions described can be implemented in hardware, software, firmware, or any combination thereof. If implemented in software, the functions can be stored on or transmitted over as one or more instructions or code on a non-transitory computer-readable medium. Non-transitory computer-readable media includes both computer storage media and communication media including any medium that facilitates transfer of a computer program from one place to another. A storage media can be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A system comprising:
 a first plurality of chassis, each of the first plurality of chassis comprising at least one first rack module and a first chassis network switch coupled to each of the at least one rack module;
 a first backplane comprising a first backplane network switch that is coupled to each of the first plurality of chassis via the first chassis network switch;
 a second plurality of chassis, each of the second plurality of chassis comprising at least one second rack module and a second chassis network switch coupled to each of the at least one second rack module;
 a second backplane comprising a second backplane network switch that is coupled to the first backplane via the first backplane network switch and is coupled to each of the second plurality of chassis; and a top-of-rack that is coupled to the first backplane via the first backplane network switch, the top-of-rack being coupled to the second backplane via the first backplane network switch and the second backplane network switch.

2. The system of claim 1, wherein the top-of-rack is coupled to a plurality of server racks.

3. The system of claim 1, wherein the first backplane network switch is coupled to each of the first plurality of chassis via a chassis connector on each of the first plurality of chassis and a corresponding backplane connector on the first backplane.

4. The system of claim 1, wherein each of the at least one rack module includes a computing sled.

5. The system of claim 1 wherein at least one of the backplane network switch or the chassis network switch includes a local area network (LAN) switch integrated circuit (IC).

6. The system of claim 1, wherein each of the at least one rack module includes a network port, and the chassis network switch is coupled to the network port of each of at least one rack module.

7. The system of claim 6, wherein each network port is a local area network (LAN) port or a RJ45 port.

8. A system comprising:
a first backplane comprising:
a first backplane top connector;
a first backplane bottom connector; and
a first backplane network switch that is coupled to the first backplane top connector and to the first backplane bottom connector, wherein the first back plane network switch is coupled to each of a first plurality of chassis via a first chassis network switch, each of the first plurality of chassis comprising at least one first rack module, the first chassis network switch coupled to each of the at least one first rack module;
a second backplane comprising:
a second backplane top connector that is coupled to the first backplane bottom connector;
a second backplane bottom connector; and
a second backplane network switch that is coupled to the second backplane top connector and to the second backplane bottom connector, wherein the second back plane network switch is coupled to each of a second plurality of chassis via a second chassis network switch, each of the second plurality of chassis comprising at least one second rack module, the second chassis network switch coupled to each of the at least one second rack module; and
a top-of-rack that is coupled to the first backplane via the first backplane network switch, the top-of-rack being coupled to the second backplane via the first backplane network switch and the second backplane network switch.

9. The system of claim 8, wherein the top-of-rack comprises a top-of-rack connector that is coupled to the first backplane via the first backplane top connector.

10. The system of claim 9, wherein the top-of-rack further comprises at least one additional top-of-rack connector and is coupled to a plurality of server racks.

11. The system of claim 8, wherein each of the at least one rack module includes a computing sled.

12. The system of claim 8, wherein the first backplane network switch includes a local area network (LAN) switch integrated circuit (IC).

13. The system of claim 8, wherein each network port is a local area network (LAN) port or a RJ45 port.

14. A method operated by a rack system, comprising:
receiving first network data from each of a first plurality of rack modules at a first chassis network switch of a first chassis network switch, the first chassis network switch coupled to each of the plurality of rack modules;
receiving the first network data from the first chassis network switch at a first backplane network switch, wherein the first back plane network switch is coupled to each of a first plurality of chassis via a first chassis network switch, each of the first plurality of chassis comprising the first plurality of rack modules;
receiving second network data from a second backplane network switch at the first backplane network switch, wherein the second back plane network switch is coupled to each of a second plurality of chassis via a second chassis network switch, each of the second plurality of chassis comprising a second plurality of rack modules, the second chassis network switch coupled to each of the second plurality of rack modules;
receiving first network data from the first backplane network switch at a top-of-rack; and
receiving the second network data from the first backplane network switch at the top-of-rack, the top-of-rack being coupled to the second backplane network switch via the first backplane network switch.

* * * * *